(12) United States Patent
Visser et al.

(10) Patent No.: US 7,623,979 B2
(45) Date of Patent: Nov. 24, 2009

(54) CALIBRATION OF TESTER AND TESTBOARD BY GOLDEN SAMPLE

(75) Inventors: Hendrik Visser, Milpitas, CA (US); Sherry Spain, Cupertino, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/567,172

(22) PCT Filed: Aug. 14, 2004

(86) PCT No.: PCT/IB2004/051461
§ 371 (c)(1),
(2), (4) Date: Feb. 3, 2006

(87) PCT Pub. No.: WO2005/017542
PCT Pub. Date: Feb. 24, 2005

(65) Prior Publication Data
US 2006/0224343 A1    Oct. 5, 2006

Related U.S. Application Data

(60) Provisional application No. 60/495,152, filed on Aug. 14, 2003.

(51) Int. Cl.
  *G01D 18/00* (2006.01)
  *G01D 21/00* (2006.01)
  *G01P 21/00* (2006.01)
  *G01R 35/00* (2006.01)

(52) U.S. Cl. .................................................... 702/85

(58) Field of Classification Search .................. 702/85, 702/107, 60, 65, 117–119, 123, 64; 324/601, 324/754
See application file for complete search history.

(56) References Cited

U.S. PATENT DOCUMENTS

| | | | |
|---|---|---|---|
| 5,256,964 A | 10/1993 | Ahmed et al. | |
| 5,262,716 A | 11/1993 | Gregory et al. | |
| 5,929,628 A | 7/1999 | Becker et al. | |
| 6,032,107 A | 2/2000 | Hitchcock | |
| 6,064,501 A * | 5/2000 | Roberts et al. | 398/11 |
| 6,480,013 B1 | 11/2002 | Nayler et al. | |
| 7,099,595 B2 * | 8/2006 | Touma | 398/177 |

FOREIGN PATENT DOCUMENTS

WO    2005/017542    *    2/2005

* cited by examiner

*Primary Examiner*—Michael P Nghiem
(74) *Attorney, Agent, or Firm*—Peter Zawilski

(57) ABSTRACT

In performing testing on Automatic Test Equipment (ATE) it is a challenge to accurately generate and measure RF (radio frequency) power. In an example embodiment, in a test apparatus used for measuring the input and output characteristics of an amplifier, there is a method for determining test program parameters. The method involves calculating input loss from the test apparatus power source to the input of the amplifier, defining an input loss correction factor. The output loss from the amplifier output to the power meter of the test apparatus is calculated, defining an output loss correction factor. Using the input loss correction factor, a real input power level is determined and using the output loss correction factor, a real output level is determined.

8 Claims, 4 Drawing Sheets

CALIBRATION OF TESTER AND TESTBOARD BY GOLDEN SAMPLE

CROSS REFERENCE TO RELATED APPLICATION

This application claims the benefit of U.S. provisional application Ser. No. 60/495,152 filed Aug. 14, 2003, which is incorporated herein whole by reference.

The invention relates to electronics manufacturing. More particularly the invention relates to the calibration of test apparatus used to verify electronic devices.

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as p-channel MOS (PMOS), n-channel MOS (NMOS) and complementary MOS (CMOS) transistors, bipolar transistors, BiCMOS transistors.

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

In a typical integrated circuit (IC) device, transistors and other components are put together to accomplish a desired function. Such desired functions include, but are not limited to, microprocessors, microcontrollers, digital signal processing (DSP), analog amplifiers, radio frequency (RF) devices, etc.

Before such devices can be used in their chosen application, it is necessary to verify the functionality. Automatic test equipment (ATE) is often used to efficiently evaluate the performance of electronic devices to determine whether the devices meet predetermined specifications, for example timing specifications. For each device, the ATE may test the device to obtain a measure of a delay between an input pin and an output that represents how fast the device performs in operation.

In an example process, after undergoing a series of manufacturing steps in wafer fabrication, the IC devices may be tested at wafer probe. The probes, or other suitable contacts, connect the die to automatic test equipment (ATE) via hardware interfaces. Failing die are marked with an ink dot. Later wafers are sawn apart and good die are parsed out for packaging. These packaged die are then tested with ATE. Packaged die meeting the requirements are collected and are sent to their ultimate end use.

In the testing of IC devices, the ATE may undergo a calibration procedure. A usual procedure is for the ATE apparatus be calibrated periodically, for example weekly. The user sets up and adjusts the instrument as it measures a calibration board (often supplied by the ATE manufacturer) specifically adapted for this purpose. The calibration procedure is usually supplied with the ATE. The calibration may include but is not limited to, timing delay within the tester hardware through a standard length delay line, voltage and current measurements through precision impedance loads, voltage and current source measurements, functional tests of relays, etc. Calibration is done on a regular basis to inform the user of drift in measurements and other maintenance the test apparatus may require.

U.S. Pat. No. 5,256,964 of Ahmed et al. relates to a method and apparatus for verifying the accuracy of a test system. More particularly, in a preferred embodiment, this invention relates to the evaluation of test systems, to the enhancement of the process of tester calibration, and to tracking between test systems.

U.S. Pat. No. 5,262,716 of Gregory, Jr. et al. relates generally to board testers, and more specifically to an improved tester calibration technique.

U.S. Pat. No. 5,929,628 of Becker et al. relates generally to automatic test equipment, and more particularly to automatic test equipment, having an amplitude calibration feature, for accurately measuring signals produced by an electronic device under test.

U.S. Pat. No. 6,032,107 of Hitchcock relates to calibrating test equipment. The invention is generally directed to using reference electronic devices that have electrical identifications to calibrate at least one channel of test equipment.

U.S. Pat. No. 6,480,013 B1 of Nayler et al. relates to the electrical testing of so-called RF integrated circuits comprising inputs and outputs designed to receive or deliver AC signals in the radio frequency (RF) domain. The present invention more particularly relates to the electrical testing of RF integrated circuits present on a silicon wafer before the wafer is sliced into individual components. This reference and those previously cited are herein incorporated by reference in their entirety.

In accordance with an embodiment of the present invention, there is in a test apparatus used for measuring the input and output characteristics of an amplifier, a method for determining test program parameters. The method comprises calculating the input loss from the test apparatus power source to the input of the amplifier and defining an input loss correction factor. The output loss is calculated from the amplifier output to the power meter of the test apparatus and defining an output loss correction factor. Using the input loss correction factor, the user may determine a real input power level to set on the test apparatus. Using the output loss correction factor, the user may determine a real output level to be measured. A feature of this embodiment is that RF tests are calibrated as a function of the input loss correction factor and the output loss correction factor. The RF tests include at least one of the following: output power, gain, efficiency, detector error, linearity, and noise figure.

In accordance with another embodiment of the present invention, there is a method for inserting calibrating factors into an ATE program. The method comprises obtaining parameters from at least one golden sample, wherein the parameters in lab gain, lab input power, and lab output power. These parameters from the golden sample are programming into the ATE test program. Measurements on the ATE are obtained from the golden sample and categorized into a lookup table. An uncorrected gain at a small input signal for a least one small input signal value is calculated. A first gain change from a first sum of a first input loss and a first output loss is determined. A first initial output loss is defined. An initial input loss from the difference of the first gain change and first initial output loss is calculated. The ATE power level is set to the sum of input power lab and initial input loss. Output power on the ATE is measured; the output power corresponds to an input power. A corrected output power is calculated; the corrected output power is the sum of output power on the ATE and the initial output loss. A feature of this embodiment further comprises, determining a degree of correlation between the corrected output power and lab output power. The degree of correlation determines whether corrected values for input power and output power are inserted in to the ATE test program or another initial output loss is defined and process is repeated.

In accordance with yet another embodiment of the present invention, used in the measuring of input and output characteristics of an amplifier, machine-readable medium comprises, a plurality of computer instructions. The computer instructions include calculating input loss from the test apparatus power source to the input of the amplifier, defining an input loss correction factor, calculating output loss from the amplifier output to the power meter of the test apparatus, defining an output loss correction factor. Using the input loss correction factor, a real input power level; using the output loss correction factor, a real output power level is determined. As a function of the input loss correction factor and the output loss correction factor, RF tests are calibrated. The RF tests include at least one of the following: output power, input power, gain, efficiency, detector error, linearity, and noise figure. The computer instructions indicate to the user the calibrating of RF tests is complete.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which:

FIG. 1 depicts losses that may be encountered in testing a power amplifier;

FIG. 2 outlines the calibration procedure according to an embodiment of the present invention;

The present invention has been found to be useful calibrating a test apparatus and load board for the testing of amplifier circuits. Although the present invention has a particular application in testing analog circuits, the techniques presented may be applicable to other families of devices, as well.

In the generation and measurement of RF power, the user is confronted with attaining and maintaining the accuracy of the tester. For a set of test devices, the results obtained on a given tester may be acceptable. However, retesting of the same set of devices on another tester yields different results. The test hardware board is the interface between the test apparatus and the actual chip.

Figure 1:
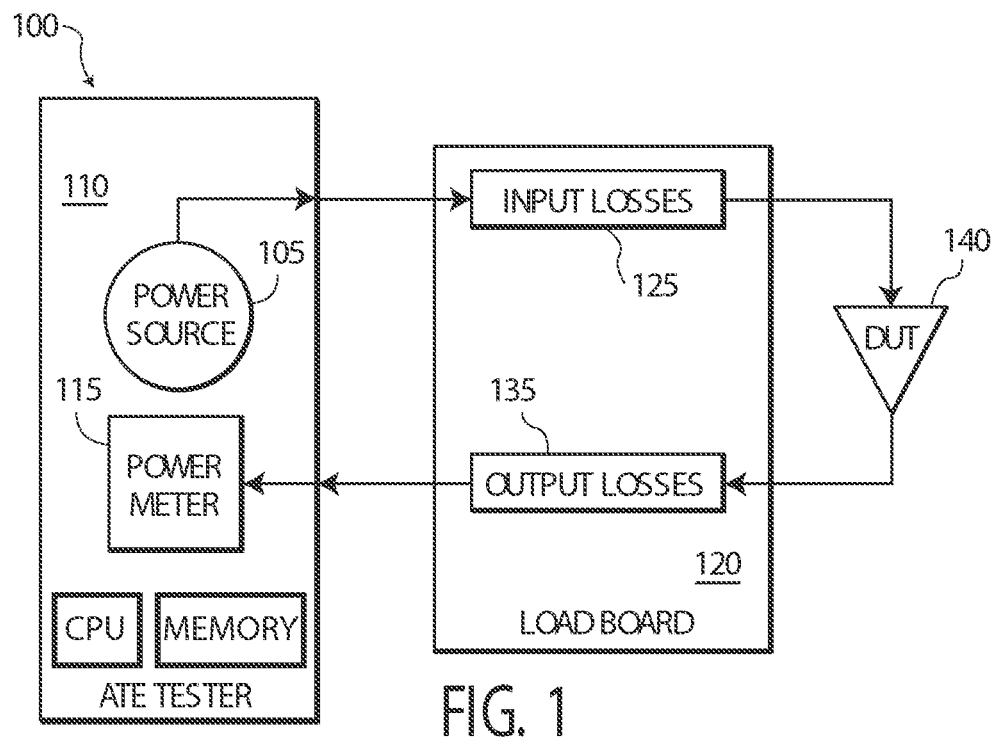

Refer to FIG. 1. An example setup 100 of a CS tester apparatus 110 and load board 120 depicts where losses may be encountered. The load board 120 has input losses 125 and output losses 135 that vary from board to board as a device 140 under test (DUT) is tested. The power source 105 has to drive more power than that measured at the DUT 140 as it overcomes input losses 125. Likewise, power meter 115 measures a lower value of DUT 140 output power as the DUT 140 output power is diminished through output losses 135. These losses have to be taken into account.

Even though the test hardware losses may be measured and taken into account during the device test, the tester accuracy remains a challenge. Minor reflections at the input or output cause differences in the resulting measurements of 0.5 dB at the input or output. The reflections follow each other fast owing to the long interconnect cable between the tester and the handler containing the test socket. The long interconnect cable often necessitated by mechanical constraints of package handling equipment. For example, a 50 MHz change in frequency at a 2.5 GHz operating region may change the losses by an additional 0.5 dB. Therefore more samples are measured and the average of the correction factors is taken. The calibration is performed across the whole frequency range.

In a particular application according to an embodiment of the present invention, a power amplifier (SA2411 manufactured by PHILIPS SEMICONDUCTORS, INC.) undergoes testing. Golden samples of SA2411 are tested. The term "golden sample" refers to a device previously tested as operating in an exemplary manner (i.e., a successfully-tested reference sample). The absolute input loss and output loss are determined. These two parameters are used throughout the entire ATE test program to compensate the source power and the measured power at the DUT. Accuracy may be assured by using a sufficient minimum number of golden samples to calibrate and average the input and output losses observed. Through an iterative loop within the ATE test program, the input and output loss factors are finely tuned.

Figure 2:
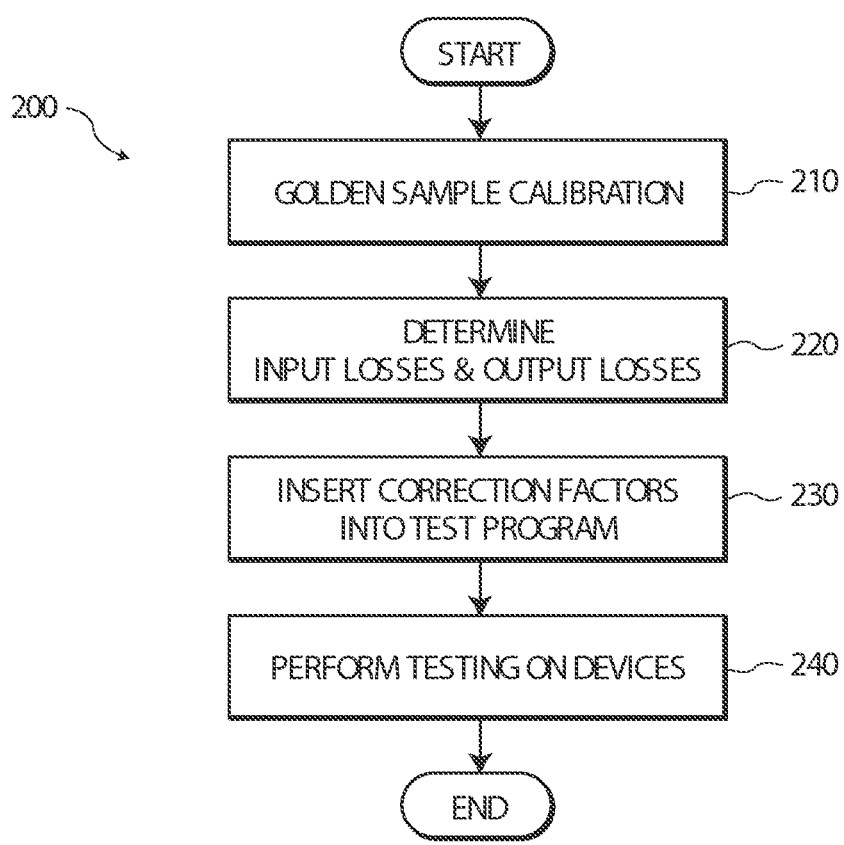

Refer to FIG. 2. The SA2411 final test program follows the flow 200. Golden samples 210 are plugged into the test hardware interface. This part of the test program determines the losses 220 related to the test hardware interface and the unknown losses within the ATE itself. The result of the calibration is two correction factors. One is for the input loss and the other is for the output loss. These correction factors 220 are inserted into the final test program 230. These correction factors are used to adjust, in advance, the input power, or after measuring, the output power. Other tests such as gain, efficiency, and detector accuracy are based upon the corrected input power and output power. Having inserted the correction factors, the user performs testing 240 on the devices so that one may distinguish between input and output loss by saturation.

For the SA2411, the following RF tests are performed. Output power ($P_{out}$), Gain, Efficiency ($E_{ff}$), Detector error (Det_err). These four tests are calibrated. Through analysis of the relationship among these parameters, the two correction factors for $P_{in}$ and $P_{out}$ are sufficient to cover the four tests. Other parameters which may be measured include, but are not limited to, the Noise Figure, IP3, IP5, and IPC, etc. For further information, Chapters 9-11 of the work titled, "Analysis and Design of Integrated Circuits 1$^{st}$ Edition" by Paul R. Gray and Robert G. Meyer may be consulted. This work is incorporated by reference herein, in its entirety.

Figure 3:
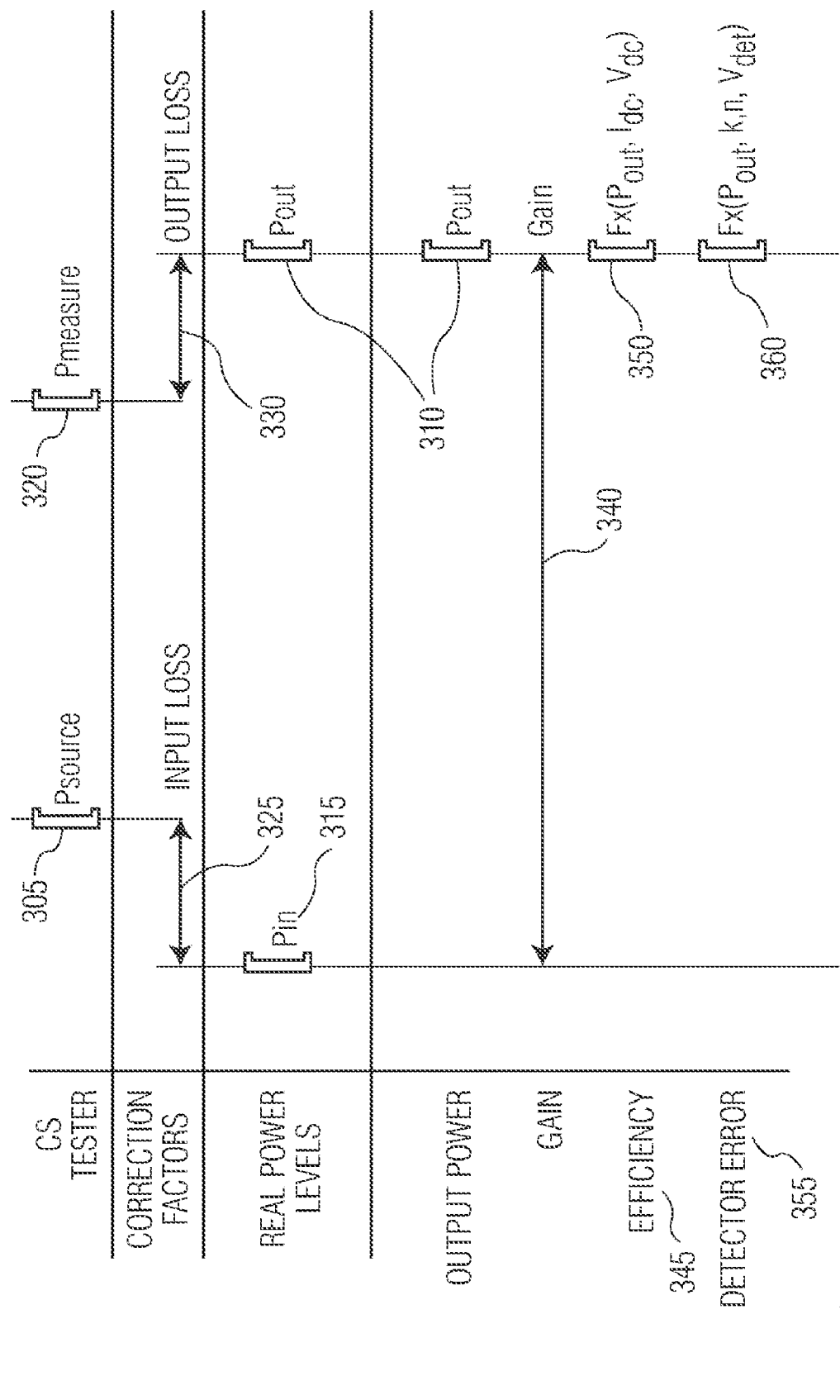
FIG. 3 depicts RF tests and derivation of correction factors according to an embodiment of the present invention.

Refer to FIG. 3. In the CS Tester, the relationship 300 of four RF tests is shown. The CS-tester is set to deliver source power ($P_{source}$) 305. What arrives at the SA2411 input is power level Pin 315. The difference is the correction factor "Input Loss" 325. The real input power Pin 315 is smaller than the power level $P_{source}$ 305 set by the CS-Tester.

The real output power "Pout" 310 coming out of the DUT is attenuated before it arrives at the CS-Tester power measurement input ($P_{measure}$) 320. The CS-Tester measures a lower power level than actually delivered by the SA2411. The difference is the correction factor "Output Loss" 330.

The gain of the SA2411 is a function based on the real input power 315 "$P_{in}$" and the real output power 310 "$P_{out}$". Measuring a gain 340 at a certain input power level means that the power level set $P_{source}$ 305 by the CS-tester has to be increased by the input loss 325 and that the output power measured P$_{measure}$ 320 has to be corrected for the output loss. The gain 340 is the difference between "Pout" and "Pin". Both values are not "P$_{source}$" and "P$_{measure}$".

The efficiency 345 is a function 350 of RF-output power, the DC-current at that RF-output power and the DC-supply voltage at that RF-output power. The equation is: E$_{eff}$=P$_{out}$ [W]/(Idc*Vdc)*100%. Note, that the real output power "P$_{out}$" has to be converted from the unit [dBm] to [W]. DC-current and DC-voltage do not need correction factors. These values are measured accurately at 0 Hz. The only RF parameter in the equation is "P$_{out}$". This is the real output power. Again "P$_{out}$" can be calculated by correcting the measured output power "P$_{measured}$" by the output loss.

The detector error 360 is a function of RF-output power, DC-detector voltage and coupling factors n and k. The coupling factors n and k are determined by the device's design.

A sufficient minimum number of golden samples of the device are tested to calibrate and average the input and output losses found. Data from outliers are discarded. The goal is to have reproducible results. Although, the SA2411 is used as an example, the techniques outlined according to the present invention may be applied to any device in which the user can saturate the output in a known way.

Figure 4:
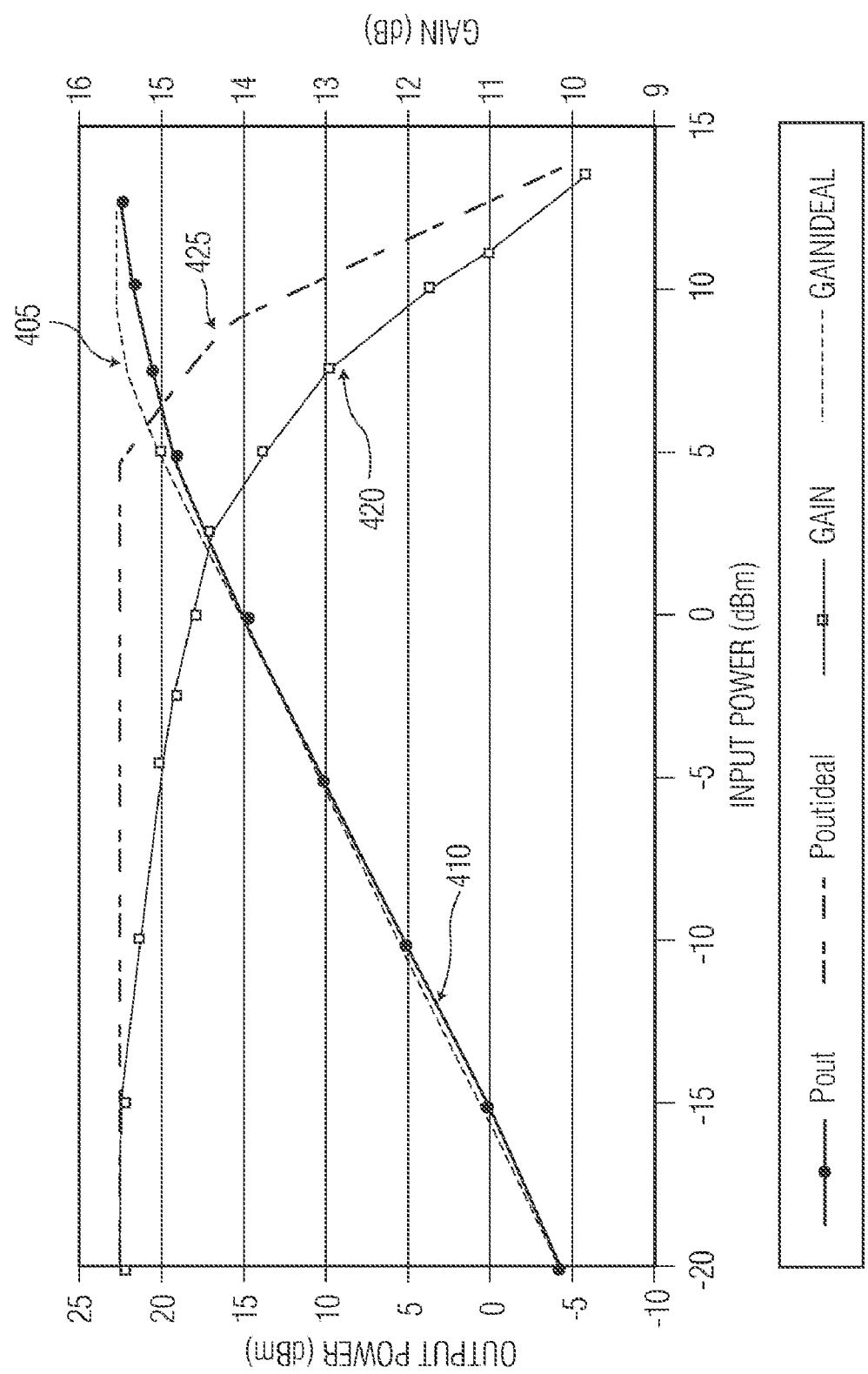
FIG. 4 depicts a curve of output power/gain versus input power for an example device.

Refer to FIG. 4. The plot 400 depicts on the X-axis, the input power 410 versus the output power and input power versus the gain 420. The ideal case of input power versus output power 405 and input power versus the gain 425 are shown in dashed lines. The gain is flat around −20 dBm. It does not matter if the input power is actually −25 dBm or −15 dBm, because the user reads the same gain value.

As the gain is the combination of two absolute powers, P$_{out}$ and P$_{in}$, there can be two corrections. One is the correction of the input power, the other of the output power. Thus, the gain measurement gives only the combination of input and output losses. There is no way of distinguishing between input loss or output loss by measuring the gain. However, if the user knows the input or the output loss, he or she can calculate the other with the above measurement.

The output loss can be measured. In the above picture it is clear that in the ideal case the output power saturated hard at 22.5 dBm. It does not matter whether the input power is +10 dBm or +14 dBm, the output power will always be +22.5 dBm. Measuring this saturated output power and than comparing it with the known value results in the output loss. The input loss can be calculated using the previous measurement (at −20 dBm) and this one.

Unfortunately the saturation is not a hard saturation for the example SA2411. For each 1 dB increase in input power, the output power increases by about 0.3 dB. So if the input power is off by 1 dB, the output power will be off by 0.3 dB, and thus the output correction is wrong by 0.3 dB and the input correction is wrong by 0.3 dB. Knowing the initial input correction and the newly found input correction, a new input power can be defined. Repeating the output loss measurement will result in a more accurate correction. If the correction is still (for example, 0.3 dB) off for the input power, keep repeating the output loss measurement.

Figure 5:
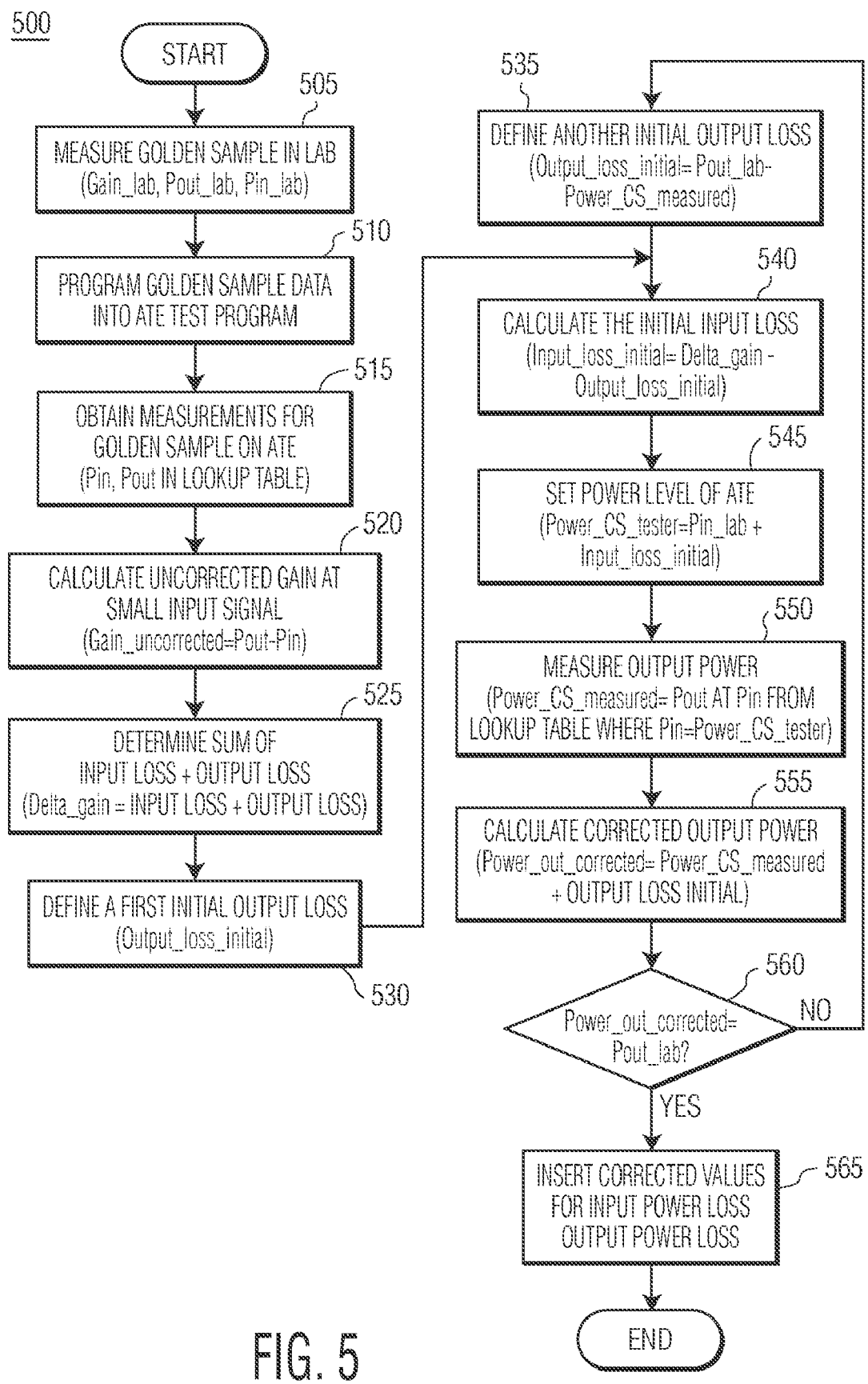
FIG. 5 outlines the calibration procedure according to an embodiment of the present invention.

Refer to FIG. 5. In an example embodiment according to the present invention, a golden sample is measured 505 on a bench set up at −20 dBm input and has a gain of 15.3 dB. At +12.5 dBm real input power the real output power is +22.7 dBm. These data obtained are programmed into the ATE test program 510 that will later be calibrated. The parameters lab gain, lab input power and lab output power are as obtained in 505 are derived from high-precision test set ups to achieve a very high accuracy in device measurements. Losses and other effects from test boards, cabling, and ATE electronics are eliminated from the measurements so that the user observes only device under test (DUT) parameters themselves.

At various tester input power levels, device output is measured on the tester 515. The P$_{in}$ and P$_{out}$ is placed in a lookup table. See Table 1.

TABLE 1

Example Data for Output Power Correction

| Tester Input Power (P$_{in}$) | Tester Output Power (P$_{out}$) | Data Programmed in Test Software |
|---|---|---|
| −20.0 | −17.48 | Pin_lab = 12.5 dBm |
| 12.0 | 11.07 | Gain_lab = 15.3 dB |
| 12.5 | 11.18 | Pout_lab = 22.7 dBm |
| 13.0 | 11.18 | |
| 13.5 | 11.49 | |
| 14.0 | 11.63 | |
| 14.5 | 11.75 | |
| 15.0 | 11.87 | |
| 15.5 | 11.98 | |
| 16.0 | 12.06 | |
| 16.5 | 12.15 | |
| 17.0 | 12.21 | |
| 17.5 | 12.26 | |
| 18.0 | 12.33 | |
| 18.5 | 12.40 | |
| 19.0 | 12.48 | |

Step1: Calculate uncorrected gain 520 (Gain_uncorrected) at small input signal (−20 dBm). Subtract this from the gain measured in the lab (Gain_lab). This number (Delta_gain) represents the sum of the Input and output loss 525:

$$\text{Gain\_uncorrected} = (-17.48) - (-20) = 2.52 \text{ dB} \quad (1.1)$$

$$\text{Gain\_lab} = 15.3 \text{ dB} \quad (1.2)$$

$$\text{Delta\_gain} = \text{Gain\_lab Gain\_uncorrected} = \text{Input loss} + \text{Output loss} \quad (1.3)$$

$$\text{Delta\_gain} = 15.3 - 2.52 = 12.78 \text{ dB} = \text{Input loss} + \text{Output Loss} \quad (1.4)$$

Step2: Define a first initial output loss 530 to +10 dB. (This is approximately correct, but this number will be changed later to obtain more accurate calibration). Calculate the initial input loss 540. Set Power level of CS-tester to 12.5 dBm+ input loss 545. Measure output power 550. Determine a corrected output power 555 and verify if output power is close to the expected value from the lab 560.

$$\text{Output loss\_initial} = 10 \text{ dB} \quad (2.1)$$

$$\begin{aligned}\text{Input loss\_initial} &= \text{Delta\_gain} - \text{Output\_loss\_initial} \\ &= 12.78 - 10 \\ &= 2.78 \text{ dB}\end{aligned} \quad (2.2)$$

$$\begin{aligned}\text{Power\_CS\_tester} &= 12.5 \text{ dB} + \text{Input\_loss\_initial} \\ &= 12.5 + 2.78 \\ &= 15.28 \text{ dB}\end{aligned} \quad (2.3)$$

$$\begin{aligned}\text{Power\_CS\_measured} &= (\text{look up table at } 15.0 \text{ dBm}) \\ &= 11.87 \text{ dBm}\end{aligned} \quad (2.4)$$

$$\begin{aligned}
\text{Power\_out\_corrected} &= \text{Power\_CS\_measured} + \quad (2.5)\\
&\quad \text{Output loss\_initial}\\
&= 11.87 + 10\\
&= 21.87\,\text{dBm}.
\end{aligned}$$

The corrected output power 555 is almost 1 dB off from the 22.7 dBm expected value. The output loss is under estimated. The initial output loss has to be increased with the difference. Repeat step 2 and call it step 3.

Step3: Set initial output loss 535 to value found In step 2: Repeat measurement as in step 2:

$$\text{Output-loss,-initial} = P\text{out\_lab} - \text{Power}CS\_\text{measured} = 22.7 - 11.87 = 10.8\,\text{dB} \quad (3.1)$$

$$\text{Input\_loss\_initial} = \text{Delta\_gain} - \text{Outputloss\_initial} = 12.78 - 10.8 = 1.98\,\text{dB} \quad (3.2)$$

$$\text{Power\_}CS\text{ tester} = 12.5\,\text{dB} + \text{Inputloss\_initial} = 12.5 + 1.98 = 14.5\,\text{dBm} \quad (3.3)$$

$$\text{Power-}CS\text{-measured} = (\text{look up table at } +14.5\,\text{dBm}) = 11.75\,\text{dBm} \quad (3.4)$$

$$\text{Power\_out corrected} = \text{Power\_}CS\_\text{measured} + \text{Output-loss\_initial} = 11.75 + 10.8 = 22.5\,\text{dBm}. \quad (3.5)$$

The corrected output power is now only 0.2 dB off from the 22.7 dBm expected value. The tester can repeat this step to find a more accurate Input power. The output loss and thus the input loss will converge to a certain value. This is the value 565 used further on in the program.

To improve the accuracy, the calibration procedure may be repeated for a number of golden samples. The average output loss and input loss can be calculated. Sample-to-sample variation is averaged out. For example, the tester repeatability on ten samples tested within a short time of one another, has been shown to be satisfactory.

In another embodiment, according to the present invention, rather than use one value of small signal gain at a given power level to set the correction factors, the user may measure small signal gain at three or more power levels. For example, small signal input power levels of −25 dB, −20 dB, and −15 dB may be applied to the sample device. The gain should be about the same in all cases. The inaccuracy in power level of the source and the measurement of the output at different signal levels is reduced. Thus, a more accurate calibration is obtained. The user has to determine the value in increasing the degree of accuracy required in light of production costs such throughput requirements, equipment, etc.

The procedures outlined herein may be stored in a computer system, such as the ATE or other equivalent. For example, a user interface via a workstation enables the user to communicate with the ATE. The ATE often has a particular programming language that has been rewritten for the needs of device testing. Such a computer system includes storage media such has magnetic disks, optical disks, memory. In an example embodiment, the calibration procedure may be resident on a remote host server accessible to clients. These server/client systems may be part of an organization's intranet or be available on the Internet, as well.

In another example embodiment, the bench setups themselves may be linked via a network to the ATE upon which the calibration procedure is applied. These links may include wires, fiber optic, or wireless, etc.

While the present invention has been described with reference to several particular example embodiments, those skilled in the art will recognize that many changes may be made thereto without departing from the spirit and scope of the present invention, which is set forth in the following claims.

What is claimed is:

1. In a test apparatus for measuring the input and output characteristics of an amplifier, a method for determining test program parameters, comprising:
   calculating input loss from the test apparatus power source to the input of the amplifier, defining an input loss correction factor;
   calculating output loss from the amplifier output to the power meter of the test apparatus, defining an output loss correction factor;
   using the input loss correction factor to determine a real input power level;
   using the output loss correction factor to determine a real output power level; and
   in response to the determined real input power and real output power, performing at least one of
      correcting an input power level and applying the corrected input power level to the amplifier, and
      correcting an output power level and outputting the output power level to a user for analyzing the amplifier.

2. The method of claim 1 further comprising,
   calibrating radio frequency (RF) tests as a function of the input loss correction factor and the output loss correction factor and using the calibrated tests when applying the corrected input power level to the amplifier,
   wherein the RF tests include tests of at least one of the following: input power, output power, gain, efficiency, and detector error, linearity, and noise figure.

3. A method for inserting calibrating factors into an automatic test equipment (ATE) program to analyze a circuit, the method comprising:
   a) obtaining parameters from at least one golden sample, wherein the parameters include lab gain, lab input power, and lab output power;
   b) programming parameters from the golden sample into ATE test program;
   c) obtaining measurements on ATE for the golden sample, categorize the measurements into a lookup table;
   d) calculating an uncorrected gain at small input signal for at least one small input signal value;
   e) determining a first sum of a first input loss and a first output loss from the first sum determine a first gain change;
   f) defining a first initial output loss;
   g) calculating an initial input loss from the difference of the first gain change and the first initial output loss;
   h) setting power level of the ATE to sum of input power lab and initial input loss and applying a test signal to the circuit at the set power level;
   i) measuring output power on the ATE wherein output power corresponds to an input power;
   j) calculating a corrected output power wherein the corrected output power is the sum of output power on the ATE and initial output loss, and outputting the corrected output power to the circuit to analyze the circuit.

4. The method of claim 3, the method further comprising:
   l) determining a degree of correlation between the corrected output power and lab output power and using the determined degree of correlation to set corrected values of the ATE test program for input power and output power to apply test inputs to the circuit or define another initial output loss, further including using the other initial output loss and performing steps g) through j) again.

5. A system for calibrating test program parameters for measuring the input and out characteristics of an amplifier, the system comprising:

means for calculating input loss from the test apparatus power source to the input of the amplifier, defining an input loss correction factor;

means for calculating output loss from the amplifier output to the power meter of the test apparatus, defining an output loss correction factor;

means for using the input loss correction factor to determine a real input power level;

means for using the output loss correction factor to determine a real output power level; and means, responsive to the determined real input power and real output power, for performing at least one of correcting an input power level and applying the corrected input power level to the amplifier, and correcting an output power level and outputting the output power level to a user for analyzing the amplifier.

6. The system of claim 5 further comprising:

means for calibrating radio frequency (RF) tests using the input loss correction factor and the output loss correction factor and for using the calibrated tests to apply a test input to the amplifier, wherein the RF tests include tests of at least one of the following: output power, gain, efficiency, detector error, linearity, and noise figure.

7. Used in the measuring of input and output characteristics of an amplifier, machine readable medium, comprising:

a plurality of computer-executable instructions, which when executed by a computer, perform the steps of calculating input loss from the test apparatus power source to the input of the amplifier, defining an input loss correction factor;

calculating output loss from the amplifier output to the power meter of the test apparatus, defining an output loss correction factor;

using the input loss correction factor to determine a real input power level;

using the output loss correction factor to determine a real output power level;

calibrating radio frequency (RF) tests as a function of the input loss correction factor and the output loss correction factor, wherein the RF tests include tests of at least one of the following: output power, gain, efficiency, and detector error, linearity, and noise figure;

indicating to the user the calibrating of RF tests is complete; and using the calibrated tests to apply test inputs to the amplifier.

8. Used in the measuring of input and output characteristics of an amplifier, machine readable medium, comprising:

a plurality of computer-executable instructions, including steps for inserting calibrating factors into an automatic test equipment (ATE) program for testing the amplifier, which when executed by a computer, perform the steps of:

a) obtaining parameters from at least one golden sample, wherein the parameters include lab gain, lab input power, and lab output power;

b) programming parameters from the golden sample into ATE test program;

c) obtaining measurements on the ATE for the golden sample and categorizing the measurements into a lookup table;

d) calculating an uncorrected gain at small input signal for at least one small input signal value;

e) determining a first sum of a first input loss and a first output loss from the first sum determine a first gain change;

f) defining a first initial output loss;

g) calculating an initial input loss from the difference of the first gain change and the first initial output loss;

h) setting the power level of the ATE to the sum of the lab input power and initial input loss;

i) measuring output power on the ATE wherein output power corresponds to an input power;

j) calculating a corrected output power, wherein the corrected output power is the sum of output power on the ATE and initial output loss; and k) determining a degree of correlation between the corrected output power with the lab output power, and using the degree of correlation to insert corrected values into the ATE test program for input power and output power, and further applying test inputs to the amplifier via the ATE test program with the inserted corrected values or define another initial output loss and further using the defined other initial output loss to perform steps g) through j) again.

* * * * *